(12) United States Patent
Chen et al.

(10) Patent No.: US 7,560,857 B2
(45) Date of Patent: Jul. 14, 2009

(54) PACKAGE STRUCTURE OF MEMS MICROPHONE

(75) Inventors: Jung-Tai Chen, Hsinchu County (TW); Chun-Hsun Chu, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/759,940

(22) Filed: Jun. 8, 2007

(65) Prior Publication Data

US 2008/0083960 A1  Apr. 10, 2008

(30) Foreign Application Priority Data

Aug. 29, 2006  (TW) .............. 95131712 A (51) Int. Cl.
*H01L 41/09* (2006.01)

(52) U.S. Cl. ................................. 310/340

(58) Field of Classification Search ............ 310/309, 310/322, 341, 340; 257/416, 704, 724, 730; 381/175; 73/754; *H01L 41/09*
See application file for complete search history.

(56) References Cited

U.S. PATENT DOCUMENTS

| | | | |
|---|---|---|---|
| 6,781,213 B2 | 8/2004 | Burr | |
| 6,781,231 B2 * | 8/2004 | Minervini | ............ 257/704 |
| 7,373,835 B2 * | 5/2008 | Matsubara | ............ 73/754 |
| 2002/0102004 A1 | 8/2002 | Minervini | |
| 2005/0018864 A1 | 1/2005 | Minervini | |
| 2006/0157841 A1 | 7/2006 | Minervini | |
| 2006/0169049 A1 * | 8/2006 | Matsubara | ............ 73/754 |

FOREIGN PATENT DOCUMENTS

| | | |
|---|---|---|
| JP | 2002-176696 | 6/2002 |
| TW | 200513131 | 4/2005 |
| TW | 200614845 | 5/2006 |
| WO | 2006/023016 | 3/2006 |

* cited by examiner

*Primary Examiner*—Quyen Leung
*Assistant Examiner*—Karen B Addison
(74) *Attorney, Agent, or Firm*—Jianq Chyun IP Office (57) ABSTRACT

A package structure of a micro-electromechanical system (MEMS) type microphone is disclosed. The MEMS microphone comprises a substrate, a MEMS chip, an acoustic wave cover, and an encapsulant. The substrate has connection pads. The MEMS chip is electrically coupled to the connection pads. The MEMS chip includes an acoustic wave sensing portion. The acoustic wave cover is fixed on the MEMS chip for covering without contacting the acoustic wave sensing portion and defining an acoustic wave cavity space. The acoustic wave cover has an opening for allowing an acoustic wave to enter or exit out of the acoustic cavity space. The encapsulant encapsulates the substrate, the MEMS chip, and the acoustic wave cover, wherein a surface of the acoustic wave cover is exposed. The exposed surface of the acoustic wave cover is along the same level as the surface of the encapsulant.

12 Claims, 9 Drawing Sheets

PACKAGE STRUCTURE OF MEMS MICROPHONE

CROSS-REFERENCE TO RELATED APPLICATION

This application claims the priority benefit of Taiwan application serial no. 95131712, filed Aug. 29, 2006. All disclosure of the Taiwan application is incorporated herein by reference.

BACKGROUND OF THE INVENTION

1. Field of the Invention

The present invention relates to a package structure and a packaging method of a micro-electromechanical (MEMS) microphone.

2. Description of Related Art

Under the influence of the popular global communication, it is common that one person may have one or more mobile phones or everyone has a mobile phone. Even students carry mobile phones to school for communicating with parents, and thus the mobile phone consumer age is significantly lowered to below 10-year old.

Further, the Topology Research Institute points out in the September 2005 research report that the global shipment quantity of the mobile phones in 2005 was about 760 million, and the number of mobile phone users may reach up to 1.685 billion. The Topology also predicts that the global mobile phone users may be up to 2.236 billion. Therefore, the market scale of mobile phone application cannot be ignored.

Along with the increasing demands for video and audio functions, currently, in mobile phones worldwide, a new microphone, in addition to the microphone used for talking, is provided for the capturing video images, so as to provide convenience in service use. Therefore, the demand for the microphone grows increasingly.

The MEMS microphone has a thin thickness and small volume. Furthermore, the surface adhering process can be performed by solder reflow to effectively reduce the assembly cost. Therefore, in order to meet the requirements of the mobile phone with small volume and low cost, the MEMS microphone applied to gradually replace the original electric condenser microphone (ECM) on the market.

Moreover, the MEMS microphone has an innate advantage of low power consumption (160 μA) that is ⅓ of that of ECM. When applied in the mobile phones with limited power storage, this power saving advantage promotes the MEMS microphone to replace the ECM.

For other products equipped with microphone, the demands for the MEMS microphone tend to grow. For example, currently, the MEMS microphone is increasingly applied in electronic products such as portable walkman and digital camera for micro hard disks and flash memories. Therefore, in the future, it is possible for the MEMS microphone to have a considerable market in the electrical application fields.

Figure 1:
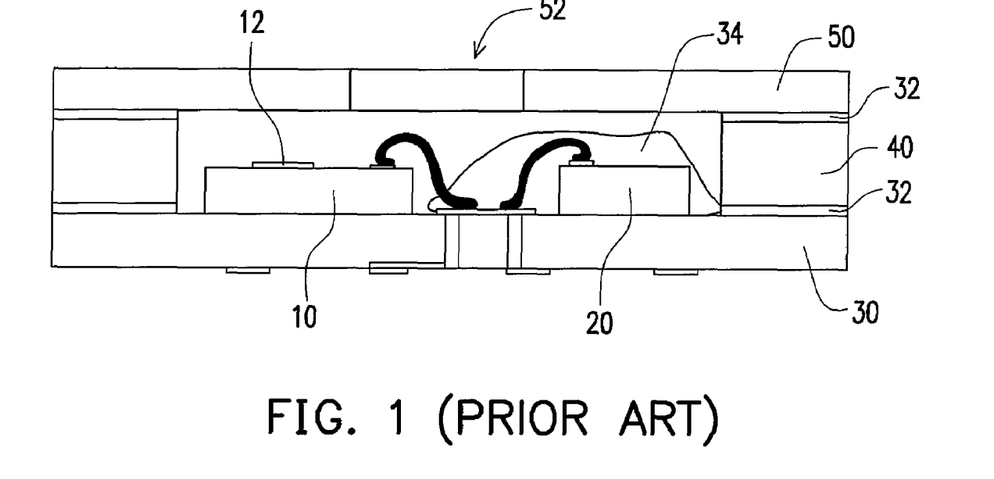
FIG. 1 is a sectional view of a conventional Knowles MEMS microphone module structure.

For the current MEMS microphone, referring to FIG. 1, a sectional view of the current Knowles MEMS microphone module structure is shown.

A MEMS microphone chip 10 and a logic chip 20 are electrically coupled to a base plate 30. By using a conductive glue 32, a support ring 40 and a top plate 50 are successively stacked on the base plate 30, so as to constitute one acoustic wave cavity space V1 (referring to FIG. 2). The MEMS microphone chip 10 has an acoustic wave sensing portion 12, and the top plate 50 has an opening 52 for allowing the acoustic wave to enter or exit out of the acoustic wave cavity space V1 to be sensed by the acoustic wave sensing portion 12. In the acoustic wave cavity space V1, a liquid compound 34 is sealed on the logic chip 20 by using a dispensing process, so as to protect the logic chip 20 and the contacts to the base plate 30. The liquid compound 34 cannot be dispensed onto the MEMS microphone chip 10 since once being dispensed on the MEMS microphone chip 10, the liquid compound 34 may flow onto the acoustic wave sensing portion 12, further affecting the performance of the MEMS microphone module.

Figure 3:
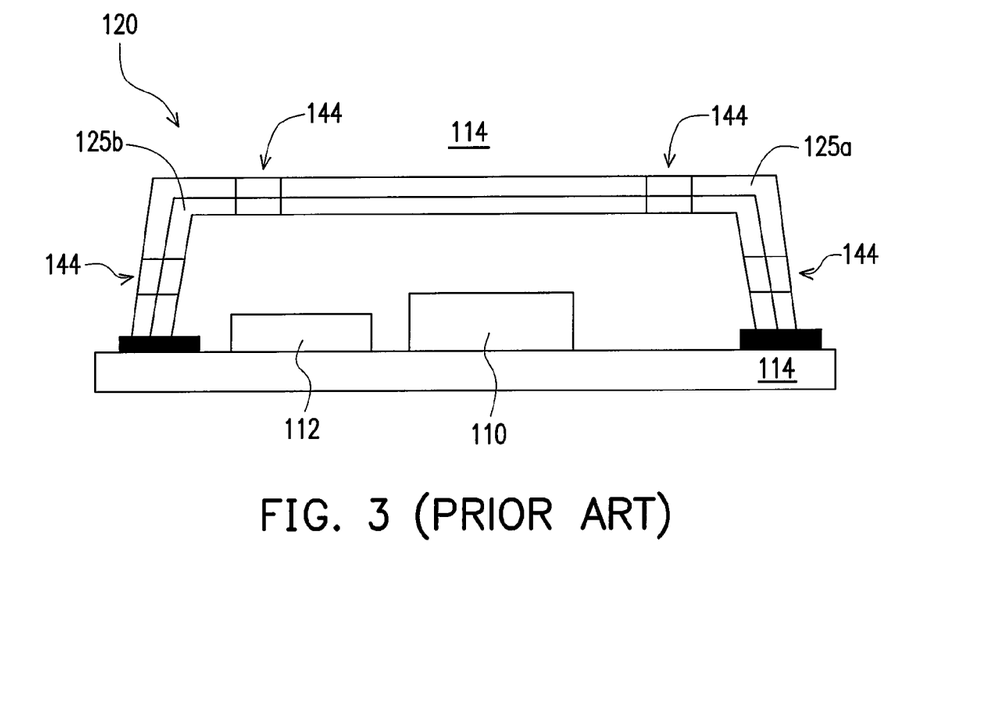
FIG. 3 is sectional view of another conventional MEMS microphone module structure.

Referring to FIG. 3, a sectional view of the MEMS microphone module structure disclosed in the U.S. Pat. No. 6,781,231 B2 according to another conventional art is shown.

A conductive housing 120 having a sound-hole 144 in the middle thereof is adopted. The housing 120 can be integrated as a whole or a combination structure of constructed by stacking through two stages. The housing 120 is used to protect the MEMS microphone chip 110 and the logic element 112 therebeneath. The conductive housing 120 and all the elements under the conductive housing 120 are not filled with any material in between. That is, all the space under the conducting housing 120 can be used as the acoustic wave transmitting space (the volume V2 of acoustic wave cavity, referring to FIG. 4).

As far as the module assembly is concerned, the sealed bonding of the integrally fabricated conductive housing 120 and the substrate 114 therebeneath is achieved by using an adhesive and a solder for one monomer at a single time. The two-stage stacked conductive housings 125a, 125b are successively selected and placed one by one and bonded by two stages. Moreover, for the solder wire of electrical interconnection in the package, the monomer dispensing method is used to dispense the liquid epoxy resin individually in the area assembled with the solder wire, and then a heating hardening process is performed to cure the epoxy resin, so as to achieve the purpose of protecting the solder wire.

Similarly, based on the above reasons, the dispensing protection cannot be used for the MEMS microphone chip.

Also, in the current technique, the MEMS microphone chip is disposed in the acoustic wave cavity space, and is not protected by the molding compound, thus resulting in the following disadvantages.

(1) If the MEMS microphone module falls onto the ground (for example the mobile phone drops onto the ground), because the solder wire contacts of the MEMS microphone chip is not protected by the molding compound and may get damaged, and the reliability of the microphone is adversely affected.

(2) The external damp easily enters from the opening (sound-hole), and affects contacts to the substrate, so that the reliability of the module is reduced.

SUMMARY OF THE INVENTION

Accordingly, the present invention is directed to a package structure of a MEMS microphone, which comprises a substrate having a connection pad; a MEMS microphone module electrically coupled to the connection pad of the substrate, and having an acoustic wave sensing portion; an acoustic wave cover, fixed on the MEMS microphone chip, and covering without touching the acoustic wave sensing portion, so as to define an acoustic wave cavity space, in which the acoustic wave cover has an opening for the acoustic wave go in or go out the acoustic wave cavity space; and an encapsulant, encapsulating the substrate, the MEMS microphone module, and the acoustic wave cover, and exposing a surface of the acoustic wave cover, wherein the exposed surface of the acoustic wave cover is even with the surface of the encapsulant.

The encapsulant encapsulating the substrate and the MEMS microphone protects the MEMS microphone chip and contacts, thereby alleviating the influence of the external vibration and the environmental damp. According to an embodiment of the present invention, the acoustic wave cavity is reserved for transmitting the acoustic wave.

According to the defined acoustic wave cavity comprises a smaller space than the conventional art, and therefore the restraining frequency is improved to obtain a broader sensing range of the acoustic wave.

Additionally, the encapsulant is used to replace the conventional top plate and support ring structure, and thus the volume of the module is greatly reduced and the relative processes of coating conductive glue between the layers can be avoided. The encapsulant may be used to replace the full cover housing structure, and the volume of the module can be greatly reduced.

The present invention is also directed to a method of packaging the MEMS microphone, which comprises the following steps. A wafer having a plurality of MEMS microphone chips is provided, wherein each of the MEMS microphone chips comprises an acoustic wave sensing portion. At least an acoustic wave cover is provided. The acoustic wave cover is bonded onto the wafer, so as to make the acoustic wave cover being fixed on the MEMS microphone chips to cover without touching the acoustic wave sensing portion. The wafer is sawed to separate the MEMS microphone chips and obtain a plurality of module units, wherein each of the module units comprises a MEMS microphone chip and an acoustic wave cover fixed on the MEMS microphone chip. A substrate having a plurality of module areas is provided, wherein each of the module area has a connection pad. The module units are electrically coupled to the connection pads of the module areas of the substrate. An encapsulant is formed with a molding compound material to encapsulate the substrate and the module units, and to expose a surface of the acoustic wave cover and make the surface of the encapsulant being even with the surface of the acoustic wave cover. And, a singulation step is performed to cut the encapsulant and the substrate according to the module areas, so as to obtain a plurality of package structures of MEMS microphone.

According to an embodiment of the present invention, a plurality of acoustic wave covers is fixed onto a plurality of MEMS microphone chips in a single step, and each component can be processed at the same time, thus the step of individually assembling the single housings may be avoided and thereby effectively increase the throughput.

According to an embodiment of the present invention, a mature molding process such as resin transfer molding can be used to package and protect a whole batch of MEMS microphone chips and the contacts in a single step, thereby saving the time for dispensing as in the case of the conventional art. Also, the process technique is mature, and thereby achieve a high production yield, high throughput, and reduce the manufacturing cost.

In the above MEMS microphone package structure, the MEMS microphone chip is a system chip which is formed by integrating the MEMS microphone chip and logic chip as a whole. Due to this characteristic, the package volume can be further reduced.

In order to the make aforementioned and other objects, features and advantages of the present invention comprehensible, a preferred embodiment accompanied with figures are described in detail below.

DESCRIPTION OF EMBODIMENTS

The First Embodiment

Referring to FIGS. 5-14, a method of packaging the MEMS microphone according to the first embodiment of the present invention is described.

Figure 5:
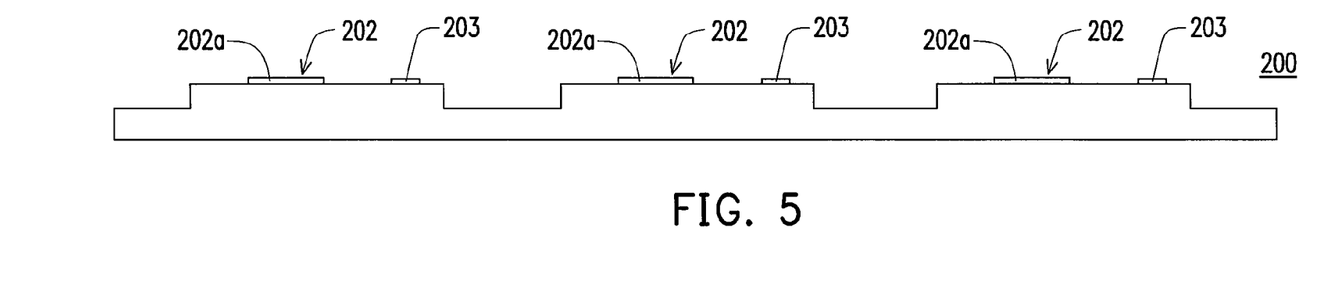
FIGS. 5-14 show a method of packaging the MEMS microphone according to a first embodiment of the present invention.
Figure 17:
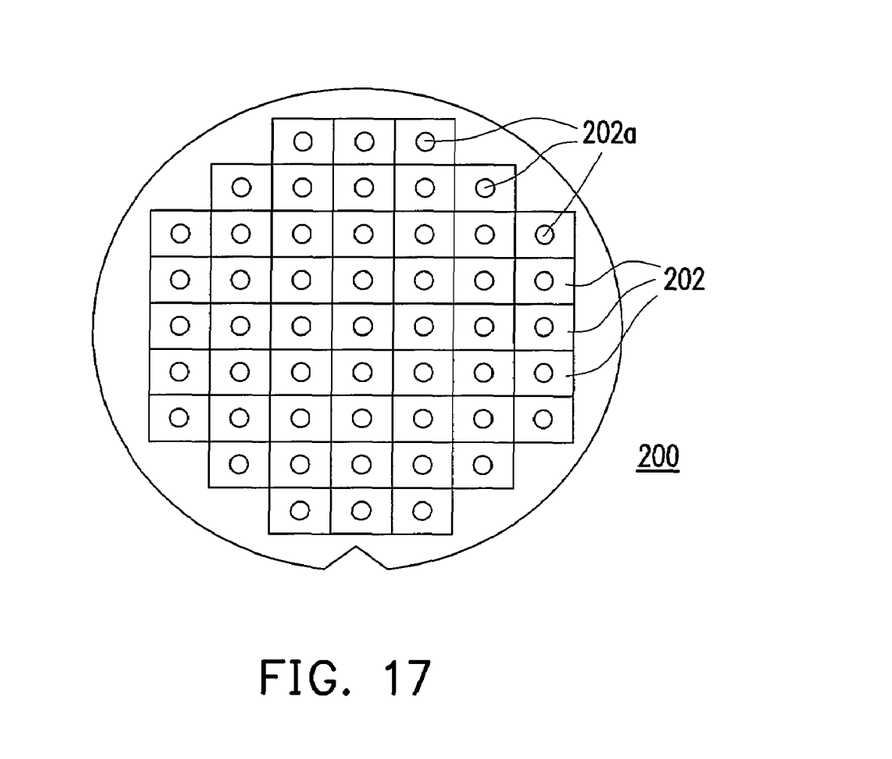
FIG. 17 is a schematic plan view of a wafer.

Referring to FIGS. 5 and 17, FIG. 17 is a schematic plan view of the wafer, and FIG. 5 is a side sectional view of FIG. 17.

A wafer 200 is provided. The surface of the wafer 200 comprises a plurality of MEMS microphone chips 202. Each of the MEMS microphone chips 202 comprises at least a bonding pad 203, as shown in FIG. 5. One bonding pad 203 and an acoustic wave sensing portion 202a for sensing the acoustic wave is shown for each MEMS microphone chip 202 for the purpose of illustration.

Figures 6, 7:
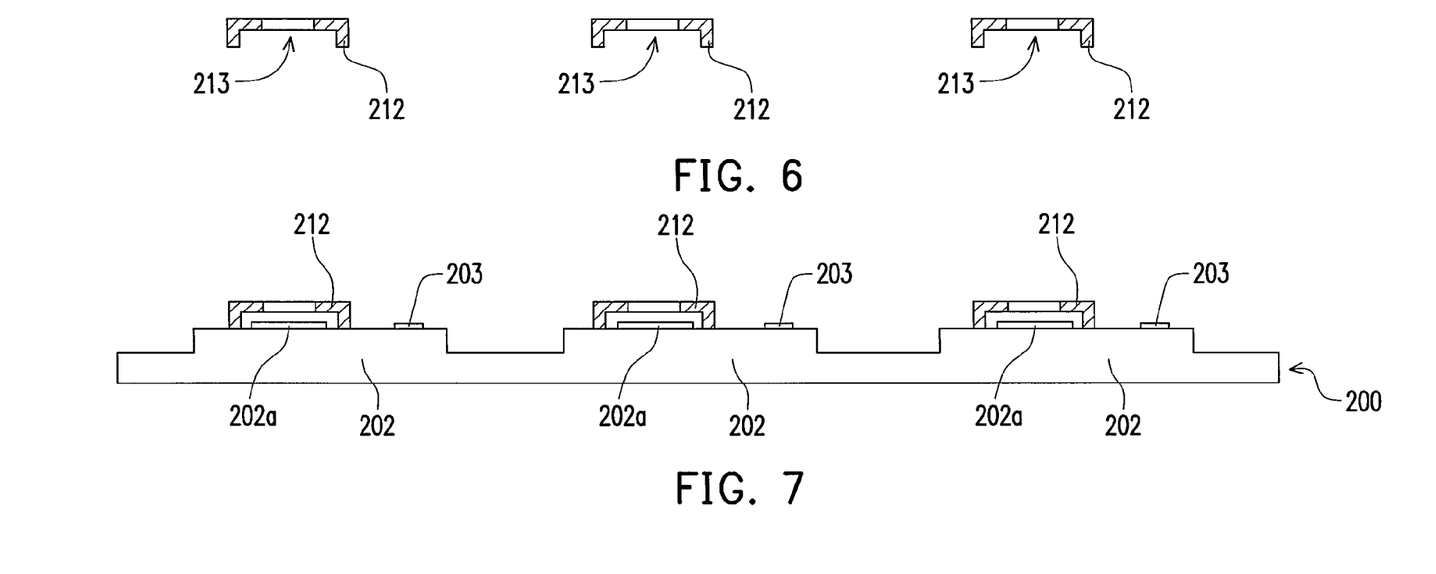

Referring to FIG. 7, at least one acoustic wave cover 212 is provided, and the material of the acoustic wave cover 212 comprises but not limited to a conductive material, an ordinary radio-frequency-interference shielding material, an electromagnetic interference shielding material, or the like. The acoustic wave cover 212 comprises at least an opening 213.

Figure 19:
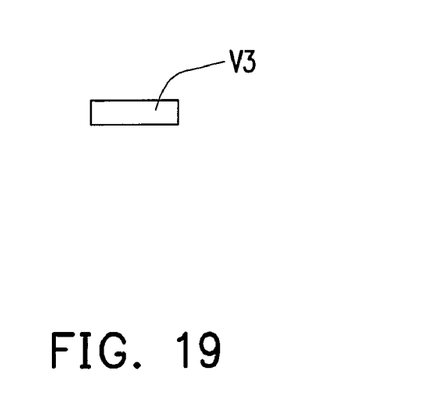
FIG. 19 shows an acoustic wave cavity in the MEMS microphone package structure according to the first embodiment of the present invention.

The acoustic wave cover 212 is bonded onto the wafer 200, and can be bonded by performing, for example, adhering or soldering, such that each acoustic wave cover 212 is fixed on each MEMS microphone chip 202. The acoustic wave cover 212 covers without contacting the acoustic wave sensing portion 202a, so as to define an acoustic wave cavity space V3 (as shown in FIG. 19) The shape of the cavity is not limited as in FIG. 19. The opening 213 of the acoustic wave cover 212 is provided for the acoustic wave to enter or exit out of the acoustic wave cavity space V3.

The method of bonding the acoustic wave cover 212 onto the MEMS microphone chip 202 is not limited herein, as long as the acoustic wave cover 212 can be fixed on the MEMS microphone chip 202 without departing from the scope of the present invention. For example, the wafer 200 can be heated, and the acoustic wave cover 212 is then pressed onto the wafer 200 to bond the two. Alternatively, when the acoustic wave cover 212 is bonded onto the wafer 200, it is acceptable to bond one acoustic wave cover 212 or a plurality of acoustic wave covers 212 in a single step.

Figure 8:
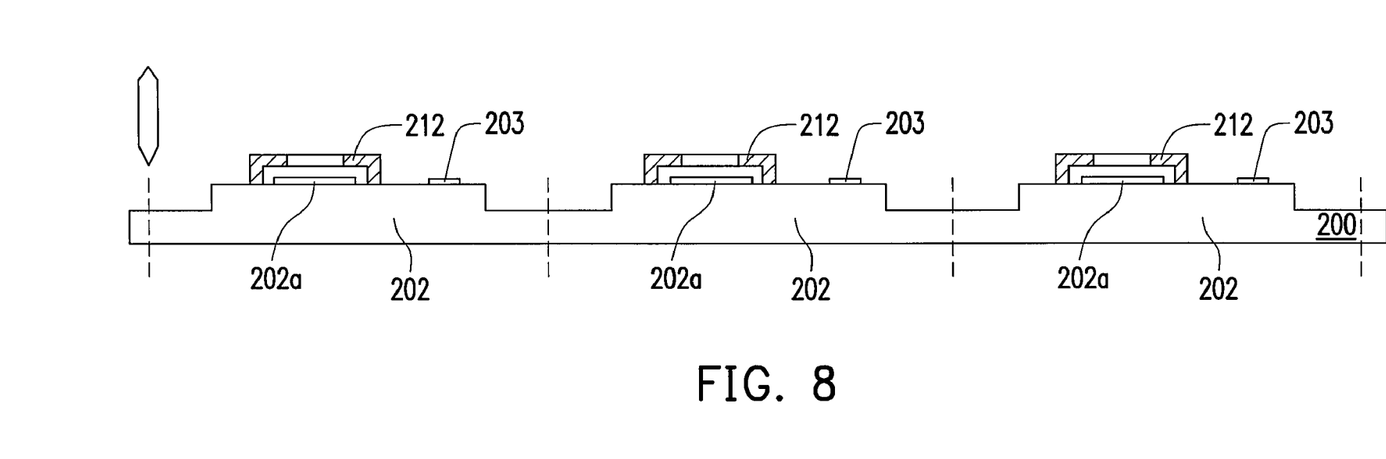
Figure 9:
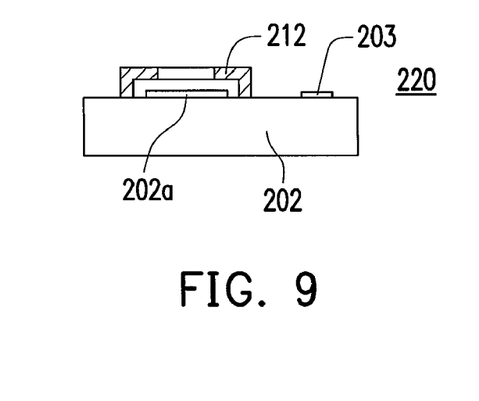

Next, referring to FIG. 8, the wafer 200 is sawed to separate the MEMS microphone chips 202 and to obtain a plurality of module units 220 (as shown in FIG. 9). Each of the module units 220 includes a MEMS microphone chip 202 and an acoustic wave cover 212 fixed on the MEMS microphone chip 202.

Figure 10:
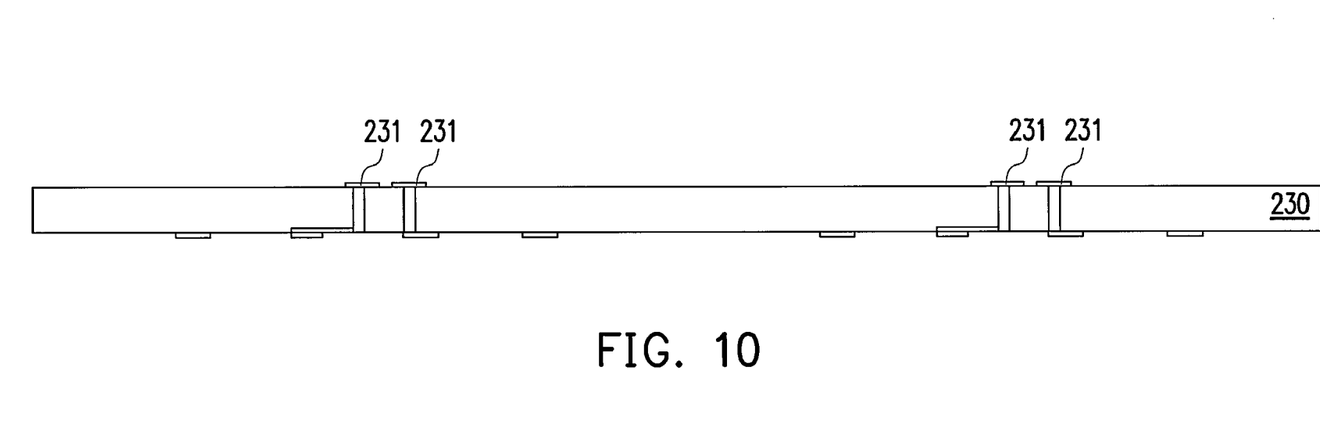
Figure 18:
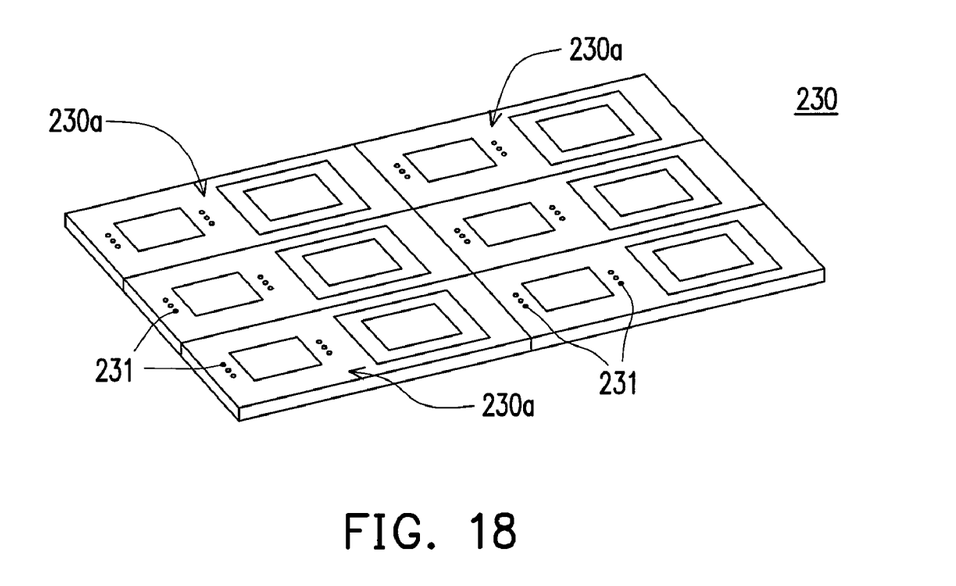
FIG. 18 is an isometric view of FIG. 10.

Referring to FIGS. 10 and 18, FIG. 10 is a schematic plan view of the substrate, and FIG. 18 is an isometric view of FIG. 10.

A substrate 230 is provided. The substrate 230 is used to carry the electronic elements and the connection elements described below. For example, the substrate 230 can be a plastic substrate, a ceramic substrate, or even a flexible substrate (Flexible Print Circuitry). In this embodiment, the substrate 230 is comprised of, for example, a PCB (printed circuit board) having a plurality of module areas 230a and one or more connection pads 231 used for electrically coupling to the electronic elements described below. However, it should be noted that the substrate 230 is not limited to a PCB, and can be any equivalent structure capable of carrying and electrically coupling the electrical elements.

Figure 11:
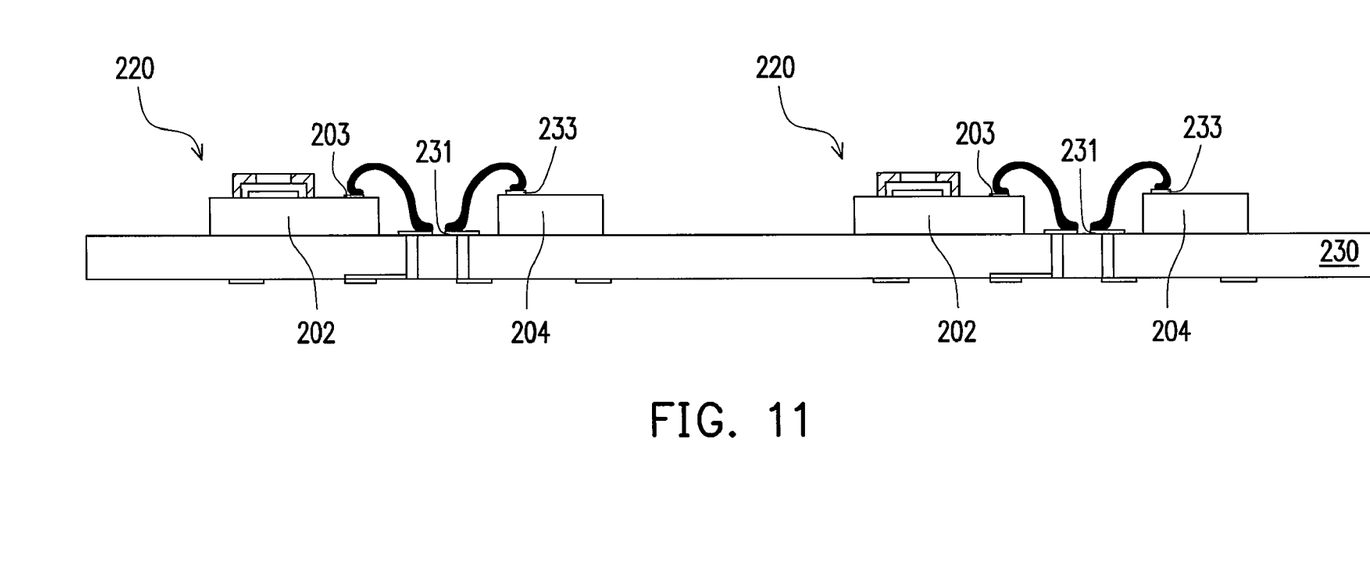
Figure 15:
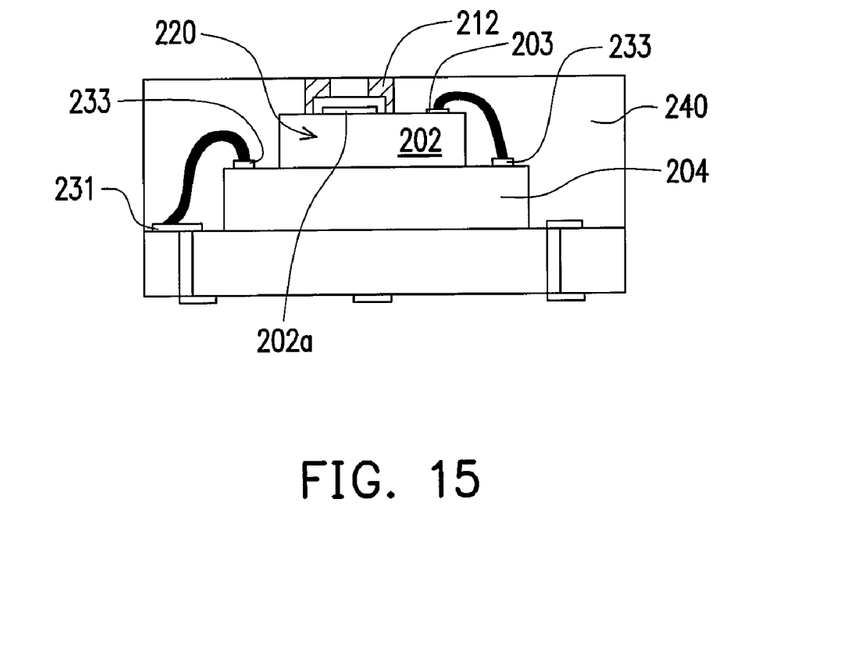
FIG. 15 shows a package structure of the MEMS microphone according to a second embodiment of the present invention.

Referring to FIG. 11, a logic chip 204 is provided. Each logic chip 204 has at least a bonding pad 233. Only one bonding pad 233 is shown on each logic chip 204 for illustration. The module units 220 and the logic chips 204 are electrically coupled to the connection pads 231 of the module areas 230a of the substrate 230. Particularly, as an example of the above electrical coupling method, the bonding pad 203 of the MEMS microphone chip 202 is directly electrically coupled to the connection pad 231 of the substrate 230, and the bonding pad 233 of the logic chip 204 is directly electrically coupled to the connection pad 230 of the substrate 230, as shown in FIG. 11. However, FIG. 11 is only an example, and is not intended to limit the scope of the present invention. The step of electrically coupling the MEMS microphone chip 202 of the module unit 220 to the connection pad 231 of the substrate 230 can also be achieved by the following method. The bonding pad 203 of the MEMS microphone chip 202 is first electrically coupled (e.g. wired) to the bonding pad 233 of the logic chip 204, and then the bonding pad 233 of the logic chip 204 is electrically coupled (e.g. wired) to the connection pad 231 of the substrate (the examples of the coupling manner are not shown in the drawings of the first embodiment, but one of the examples is shown in FIG. 15 of the second embodiment below).

Figure 12:
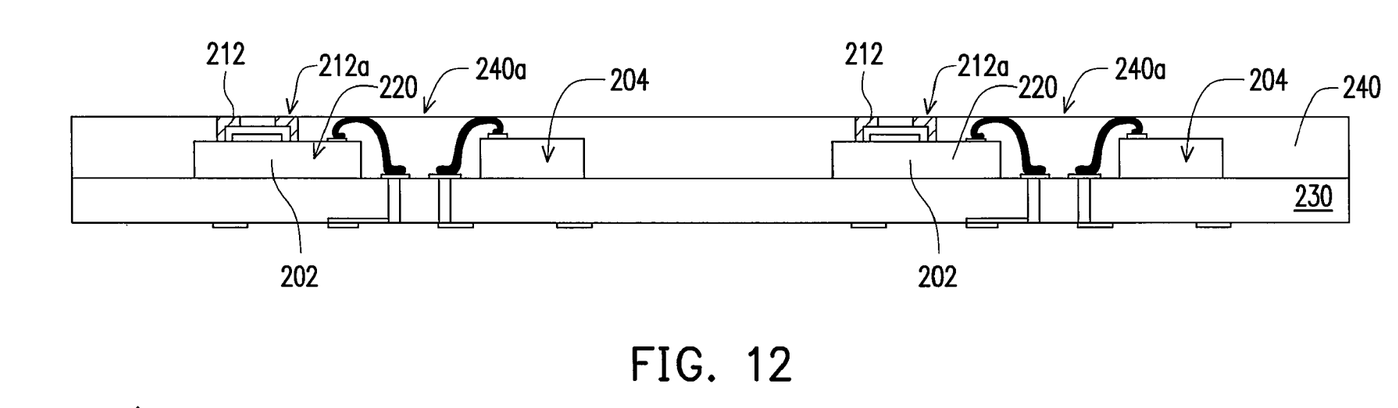

Referring to FIG. 12, a molding compound material is used to form the encapsulant 240 which encapsulates the substrate 230, the module unit 220, and the logic chip 204, exposes the surface 212a of the acoustic wave cover 212 and uses the predetermined shape of the mould to make the surface 240a of the encapsulant 240 being even with the surface 212a of the acoustic wave cover 212. The molding compound material is a material commonly used in the packaging process, for example, it can be a resin material such as epoxy resin.

Figure 13:
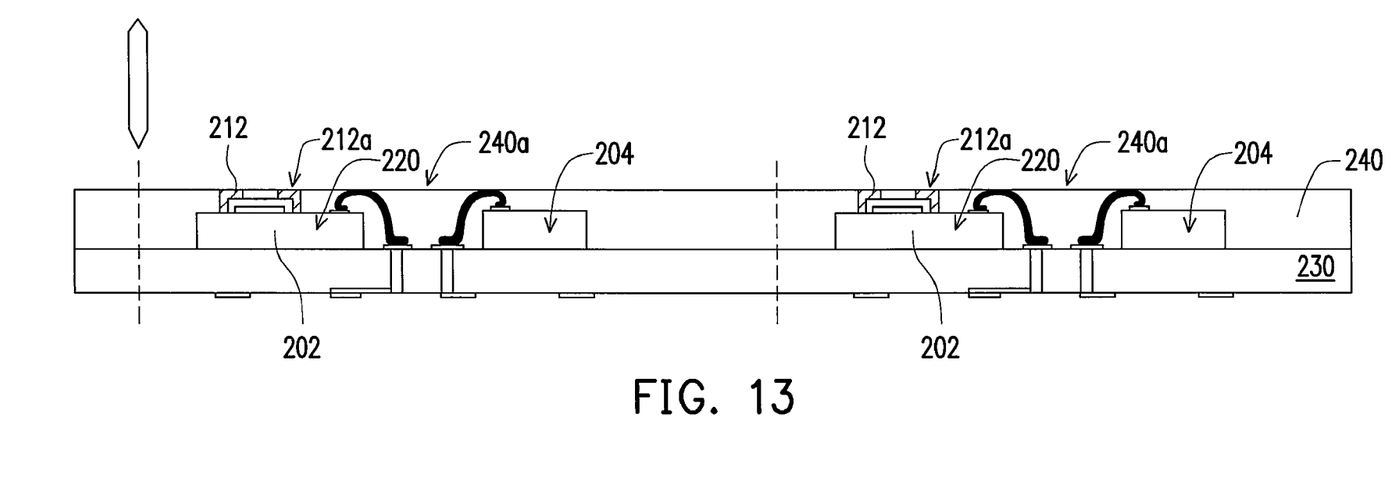
Figure 14:
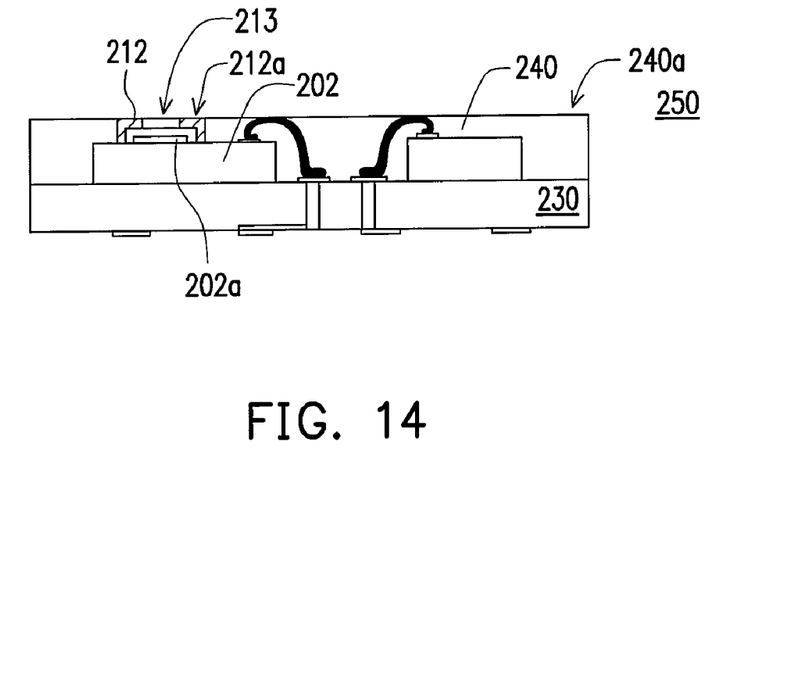

Referring to FIG. 13, a singulation step is performed for sawing and separating the encapsulant 240 and the substrate 230 according to the module areas 230a, so as to obtain a plurality of MEMS microphone package structures 250 (as shown in FIG. 14).

In this embodiment, although the MEMS microphone chip and the logic chip are encapsulated together in an encapsulant, however the present invention is not limited there-to, the logic chip can also be disposed outside the encapsulant.

According to an embodiment of the present invention, the MEMS microphone chip and the contacts are protected so as to alleviate the influence of the external vibration and the environmental damp. According to an embodiment of the present invention, the acoustic wave cavity can be reserved for transmitting the acoustic wave.

According to the Helmholtz resonance principle, the restraining frequency $f_e$ may be expressed by the following formula:

$$f_e = \frac{c}{2\pi}\sqrt{\frac{s}{Vl_e}} \quad \text{(Formula 1)}$$

In formula 1, V represents the volume of the acoustic wave cavity. That is, the volume of the acoustic wave cavity is smaller, and the restraining frequency $f_e$ is higher.

Figure 2:
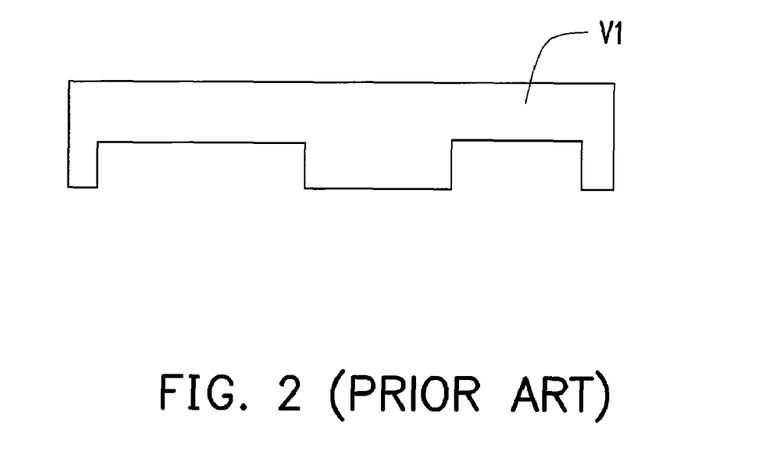
FIG. 2 shows an acoustic wave cavity of the MEMS microphone module structure of FIG. 1.
Figure 4:
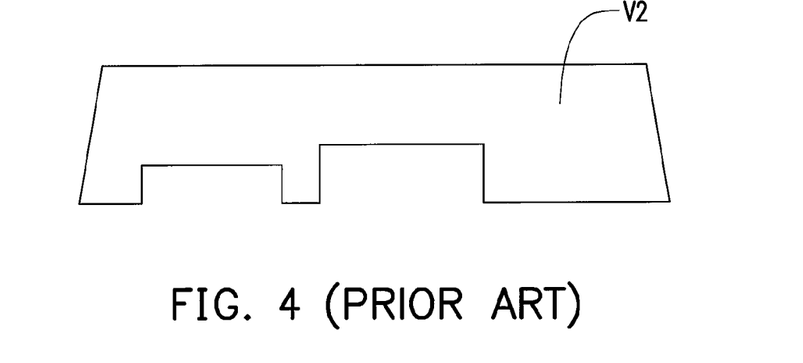
FIG. 4 shows an acoustic wave cavity of the MEMS microphone module structure of FIG. 3.

According to an embodiment of the present invention, the defined acoustic wave cavity space is smaller than that of the conventional art (the conventional acoustic wave cavity is V1 of FIG. 2 and V2 of FIG. 4, and the acoustic wave cavity of the present invention is V3 of FIG. 19. It is obvious that V3 is smaller than V1 and is also smaller than V2). Therefore, the restraining frequency $f_e$ can be improved to expand the sensing range of the acoustic wave.

The encapsulant is used to replace the top plate and support ring structure of the conventional MEMS microphone module, so that the related process of coating conductive glue between the layers can be avoided so that the thickness of the module is reduced and the area of bonding pad can be reduced. Thus, the volume of the MEMS microphone module may be significantly reduced. Alternatively, the encapsulant is used to replace the full cover housing structure of the conventional MEMS microphone module so that the volume of the MEMS microphone module can be significantly reduced. According to the specification of the popular products worldwide, the thickness of the current Knowles MEMS microphone module is about 1.65 mm, and the area of the bonding pad is about 6.2*3.8 mm. However, the thickness of the package structure of the embodiment of the present invention can be up to 1.4 mm, and the area of the bonding pad is about 4.8*2.7 mm. Accordingly, the volume of the MEMS microphone module can be reduced to about 48% of that of the conventional MEMS microphone module.

By bonding the wafer having a plurality of MEMS microphone chips with a plurality of acoustic wave covers, a plurality of acoustic wave covers can be fixed on a plurality of MEMS microphone chips at the same time, and each component can be processed at the same time so that the process of individually assembling the single housing at each discrete step may be effectively avoided. That is, according to the present invention, thousands of acoustic wave covers and MEMS acoustic wave sensing chips can be bonded simultaneously in one process step before going through the sawing process, thus the production throughput can be greatly increased.

According to an embodiment of the present invention, a mature molding process such as resin transfer molding process can be used to package and protect a whole batch of MEMS microphone chips and the contacts at the same time so that the time for individually dispensing as in the conventional art may be effectively reduced. Also, because the process technique is mature, and therefore production throughput and yield, increasing the throughput, and reducing the manufacturing cost.

In the MEMS microphone package structure described above, the MEMS microphone chip can also be a system chip formed by integrating the MEMS microphone chip and the logic chip as a whole. Thus, the package volume can be further reduced.

The Second Embodiment

In the first embodiment, the MEMS microphone chip 202 and the logic chip 204 are disposed at the different positions of the substrate 230, for example, disposed parallel on the substrate 230. Referring to FIG. 15, in the second embodiment of the present invention, the MEMS microphone chip 202 is stacked on the logic chip 204. For example, the module unit 220 is stacked on the logic chip after the module unit 220 is obtained. In this embodiment, the electrical coupling of the MEMS microphone chip 202 and the substrate 230 is achieved by electrically coupling the bonding pad 203 of the MEMS microphone chip 202 to the bonding pad 233 of the logic chip 204, and then the connection pad 231 of the substrate is electrically coupled via the bonding pad 233 of the logic chip 204.

The Third Embodiment

Figure 16:
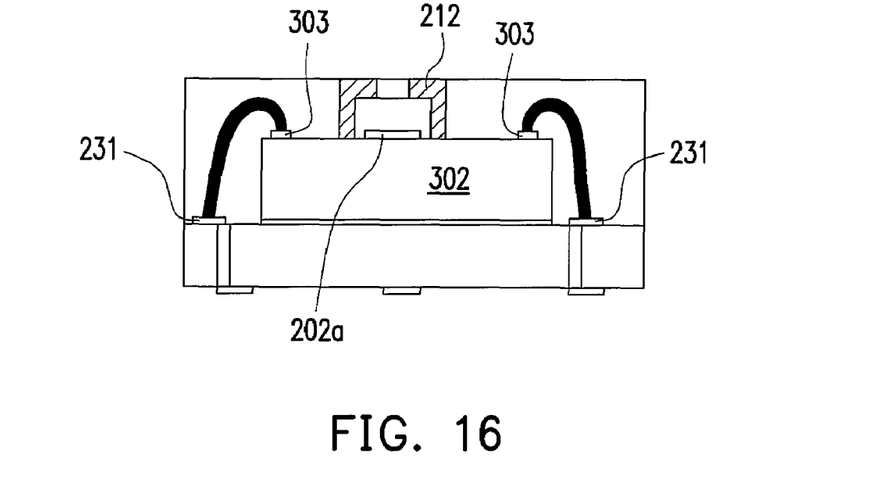
FIG. 16 shows a package structure of the MEMS microphone according to a third embodiment of the present invention.

In the second embodiment, the MEMS microphone chip 202 is stacked on the logic chip 204. Referring to FIG. 16, in the third embodiment of the present invention, the system chip 302 formed by integrating the MEMS microphone chip and the logic chip as whole can be adopted to replace the above stacking structure. The bonding pad 303 of the system chip 302 is directly wire-bonded to the connection pad 231 of the substrate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure of a micro-electromechanical system (MEMS) type microphone, comprising:
a substrate, having a connection pad;
a MEMS microphone module, electrically coupled to the connection pad of the substrate, comprising an acoustic wave sensing portion;
an acoustic wave cover, fixed on the MEMS microphone module to be in physical contact with the MEMS microphone module, for covering without contacting the acoustic wave sensing portion to define an acoustic wave cavity space, wherein the acoustic wave cover comprises an opening for the acoustic wave to enter or exit out of the acoustic wave cavity space; and
an encapsulant, encapsulating the substrate, the MEMS microphone module and the acoustic wave cover to be in physical contact with the MEMS microphone module, wherein a surface of the acoustic wave cover is exposed, and wherein the exposed surface of the acoustic wave cover is along a same plane as a surface of the encapsulant.

2. The package structure of the MEMS microphone as claimed in claim 1, wherein the acoustic wave cover comprises a conductive material.

3. The package structure of the MEMS microphone as claimed in claim 1, wherein the acoustic wave cover comprises a radio-frequency-interference (RFI) shielding material.

4. The package structure of the MEMS microphone as claimed in claim 1, wherein the acoustic wave cover comprises an electromagnetic interference shielding material.

5. The package structure of the MEMS microphone as claimed in claim 1, wherein the substrate comprises a ceramic substrate.

6. The package structure of the MEMS microphone as claimed in claim 1, wherein the substrate comprises a plastic substrate.

7. The package structure of the MEMS microphone as claimed in claim 1, wherein the substrate comprises a flexible substrate.

8. The package structure of the MEMS microphone as claimed in claim 1, wherein the MEMS microphone module comprises a MEMS microphone chip.

9. The package structure of the MEMS microphone as claimed in claim 8, wherein the MEMS microphone module comprises a logic chip, the acoustic wave sensing portion is disposed on the MEMS microphone chip, and the acoustic wave cover is fixed on the MEMS microphone chip.

10. The package structure of the MEMS microphone as claimed in claim 9, wherein the MEMS microphone chip is stacked on the logic chip.

11. The package structure of the MEMS microphone as claimed in claim 1, wherein the MEMS microphone module is a system chip which is formed by integrating a MEMS microphone chip and a logic chip.

12. The package structure of the MEMS microphone as claimed in claim 1, wherein the encapsulant comprises a resin material.

* * * * *